United States Patent [19]
Yonehara

[11] Patent Number: 5,393,646
[45] Date of Patent: Feb. 28, 1995

[54] METHOD FOR SELECTIVE FORMATION OF A DEPOSITED FILM

[75] Inventor: Takao Yonehara, Atsugi, Japan

[73] Assignee: Canon Kabushiki Kaisha, Tokyo, Japan

[21] Appl. No.: 3,693

[22] Filed: Jan. 19, 1993

Related U.S. Application Data

[63] Continuation of Ser. No. 729,894, Jul. 15, 1991, abandoned, which is a continuation of Ser. No. 445,943, Dec. 8, 1989, abandoned, which is a continuation of Ser. No. 284,814, Dec. 14, 1988, abandoned, which is a continuation of Ser. No. 914,318, Oct. 2, 1986, abandoned.

[30] Foreign Application Priority Data

Oct. 7, 1985 [JP] Japan ................... 60-223394
Oct. 7, 1985 [JP] Japan ................... 60-223395

[51] Int. Cl.$^6$ .................................. G03F 7/00
[52] U.S. Cl. ......................... 430/313; 430/314; 430/317; 430/323
[58] Field of Search ............... 430/313, 314, 317, 323; 427/250, 252, 253, 255, 248.1, 259, 261; 156/612

[56] References Cited

U.S. PATENT DOCUMENTS

| | | | |
|---|---|---|---|
| 3,697,342 | 10/1972 | Cuomo ................... | 156/13 |
| 3,697,343 | 10/1972 | Cuomo et al. ........... | 156/13 |
| 4,182,647 | 1/1980 | Yoshihara et al. ...... | 430/314 |
| 4,586,980 | 5/1986 | Hirai et al. ............. | 156/655 |
| 4,595,608 | 6/1986 | King et al. ............. | 427/237 |
| 4,597,167 | 7/1986 | Moriya et al. ......... | 29/590 |
| 5,100,691 | 3/1992 | Tokunaga et al. ...... | 427/38 |

FOREIGN PATENT DOCUMENTS 2151127  7/1980  Germany .
1229128  4/1971  United Kingdom .

OTHER PUBLICATIONS

Claassann et al, "The Nucleation of CVD Silicon . . . " J. Electro-Chem. Soc.; Solid–State and Technol., vol. 128(6), Jun. 1981, p. 1353.

Claassan et al., "The Nucleation of CVD Silicon . . . " J. Electro. Chem. Soc.; Solid–State Sci. and Technolo., vol. 127 (1), Jan. 1980, p. 194.

Claassen, et al., "The Nucleation of CVD Silicon on $SiO_2$ and $Si_3N_3$ Substrates", J. Electrochem Soc., 127 pp. 194–202 (1980).

Claassen, et al., "The Nucleation of CVD Silicon on $SiO_2$ and $Si_3N_3$ Substrates", J. Electrochem. Soc., 128 pp. 1353–1359 (1981).

Nguyen, et al., "The Variation of Physical Properties of Plasma-Deposited Silicon Nitride and Oxynitride with Their Compositions", J. Electrochem. Soc., 131 pp. 2348–2353 (1984).

Primary Examiner—Thorl Chea
Attorney, Agent, or Firm—Fitzpatrick, Cella, Harper & Scinto

[57] ABSTRACT

A method for selective formation of a deposited film comprises forming selectively a deposited film of a desired pattern on a deposition surface comprising a plurality of different kinds of materials formed corresponding to said pattern and providing different nucleus forming densities to the deposited film forming material.

4 Claims, 5 Drawing Sheets

METHOD FOR SELECTIVE FORMATION OF A DEPOSITED FILM

This application is a continuation of application Ser. No. 07/729,894, filed Jul. 15, 1991, now abandoned, which is a continuation of application Ser. No. 07/445,943, filed Dec. 8, 1989, now abandoned, which is a continuation of application Ser. No. 07/284,814, filed Dec. 14, 1988, now abandoned, which is a continuation of application Ser. No. 06/914,318, filed Oct. 2, 1986, which is now abandoned.

BACKGROUND OF THE INVENTION

1. Field of the Invention

This invention relates to a method for selective formation of a deposited film, particularly to a selective formation method which forms a deposited film of a desired pattern self-adjustedly.

The method for selective formation of a deposited film according to the present invention may be applicable for, for example, preparation of thin films to be used for semiconductor integrated circuit devices, optical integrated circuit devices, magnetic circuit devices, etc.

2. Related Background Art

As a method for desirably forming a desired deposited film on a desired portion of a desired substrate, there has been heretofore known the deposited film formation method utilizing the photolithographic technique.

FIGS. 1A–1E illustrate an example of the steps showing the method for forming a thin film type deposited film according to photolithography of the prior art.

First, a substrate 101 comprising a material species with a uniform composition as shown in FIG. 1A is washed, and subsequently a thin film 102 is deposited on the whole surface of the substrate 101 according to various thin film deposition methods (vacuum deposition method, sputtering method, plasma discharge method, MBE method, CVD method, etc.) [FIG. 1B].

Subsequently, a photoresist 103 is applied on the thin film 102, [FIG. 1C], the photoresist 3 is exposed to light by use of a photomask of a desired pattern and the photoresist 103 is partially removed by developing [FIG. 1D].

The thin film 102 is subjected to etching with the residual photoresist 103 as the mask to form a thin film 102 of a desired pattern [FIG. 1E].

By repeating such photolithographic steps, thin films of desired patterns are laminated to constitute an integrated circuit. In this case, alignment between the thin films of the respective layers is a very important factor for the characteristics of an element. Particularly, in the case of VLSI where precision of submicron is demanded, the precision of the shape of the thin film of each layer is also extremely important along with alignment.

However, in the thin film forming method of the prior art as described above, it is difficult to effect necessary alignment of the photomask with good precision, and also the precision of the shape is insufficient, because thin films of desired patterns are formed by etching.

FIGS. 2A–2D illustrate another example of the steps showing the method for forming a thin film by use of lift-off of the prior art.

First, a substrate 201 is coated with a photoresist 204, [FIG. 2A], and a photoresist 204 of a desired pattern is removed by photolithography [FIG. 2B].

Subsequently, a thin film 205 is deposited according to the thin film depositing method [FIG. 2C], and the residual photoresist 204 is removed by dissolution. The thin film on the residual photoresist 204 is thereby removed at the same time to form a thin film 205 of a desired pattern [FIG. 2D]. The above steps are repeated to constitute an integrated circuit.

However, such a deposited film formation method performs formation of a deposited film on a photoresist and therefore it is required to perform formation of a deposited film at a temperature not higher than the resistant temperature of the photoresist, whereby the deposition method is greatly restricted. Also, in removing the photoresist, the shape of the residual deposited film is affected thereby to give insufficient precision of shape. Further, there is also a problem such that the possibility of contamination at the side wall portion or inner portion of the deposited film with carbon, etc. which is a component of the photo-resist is high, On the other hand, as the selective deposition method, it has been known to cover partially a single crystalline substrate with an amorphous thin film and effecting epitaxial growth of the same material as the substrate material selectively only on the exposed portion of the single crystalline substrate. For example, there are the selective epitaxial growth (SEG) method in which silicon is selectively grown with partial coverage of a single crystalline silicon substrate with silicon oxide (B. D. Joyce & J. A. Baldrey, Nature, vol. 195, 485, 1962), the method in which epitaxial growth of GaAs is selectively effected with coverage of a GaAs substrate with an amorphous thin film such as of $SiO_2$, $Si_3N_4$, etc. (P. Rai-Choudhury & D. K. Schroder, J. Electrochem. soc. 118, 107, 1971), etc.

However, according to these selective deposition methods, since the same kind of single crystalline semiconductor is selectively grown on the exposed surface of the single crystalline substrate, the deposition surface for the ground is limited to the single crystalline semiconductor, and they are not applicable for insulating substrates.

SUMMARY OF THE INVENTION

It is, therefore, an object of this invention to provide a method for selective formation of a deposited film which solves all the problems of the prior art methods as described above.

Another object of this invention is to provide a method for selective formation of a deposited film which has simplified steps and by which a deposited film can be selectively formed with good precision on a desired portion of a desired substrate.

Still another object of this invention is to provide a method for selective formation of a deposited film by which a deposited film of a desired pattern can selectively be formed on an insulating substrate.

Yet another object of this invention is to provide a method for selective formation of a deposited film by which element separation region can be formed easily.

DESCRIPTION OF THE PREFERRED EMBODIMENT

First, the deposited film forming process is generally considered as follows.

When the substrate which is the deposited surface is made of material different in kind from the flying atoms, particularly amorphous material, the flying atoms reaching the substrate will be freely diffused on the substrate surface or reevaporated. And, as a result of collision mutually between the atoms, a nucleus is formed and, when the nucleus becomes to have a size $r_c$ or greater (stable nucleus) such that the change ΔG in its free energy G becomes the maximum, ΔG will be reduced and the nucleus continues to grow three-dimensionally stably to become shaped in islands.

The change ΔG in free energy generated by formation of nucleus may be represented as follows:

$$\Delta G = 4\pi f(\theta)(\sigma_0 r^2 + \tfrac{1}{3} \cdot g v \cdot r^3)$$

$$f(\theta) = \tfrac{1}{4}(2 - 3\cos\theta + \cos^2\theta)$$

where
 r: radius of curvature of nucleus;
 θ: contact angle of nucleus;
 gv: free energy per unit volume; and
 $\sigma_0$: surface energy of nucleus and true space.

Figure 1A:
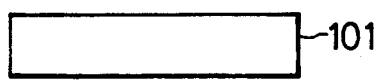
FIGS. 1A–1E illustrate the steps showing the method for forming a thin film according to photolithography of the prior art.
Figure 2A:
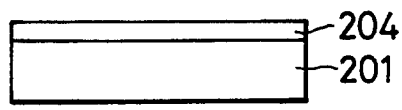
FIGS. 2A–2D illustrate the steps showing the method for forming a thin film by use of lift-off of the prior art.
Figure 1B:
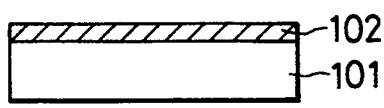
Figure 2B:
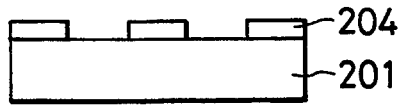
Figure 1C:
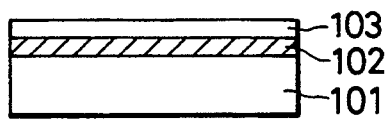
Figure 2C:
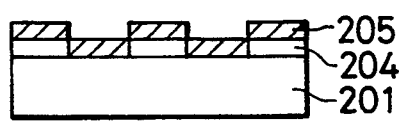
Figure 1D:
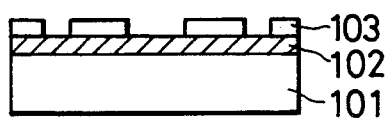
Figure 2D:
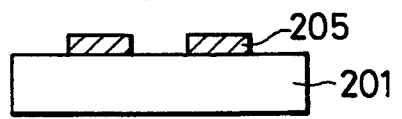
Figure 1E:
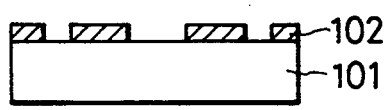
Figure 3:
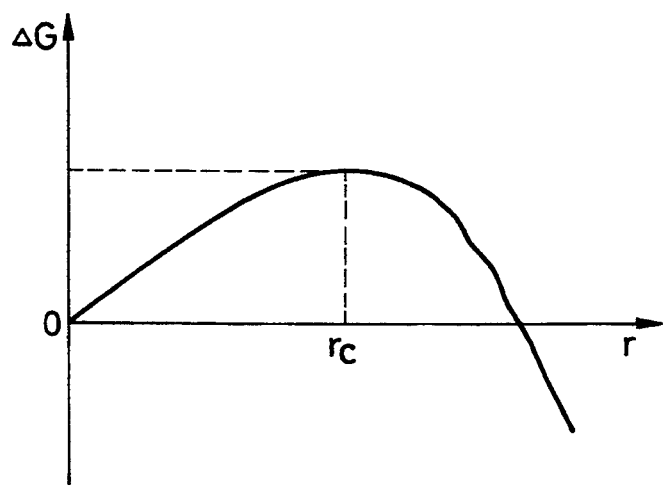
FIG. 3 is a graph showing the relationship between the change ΔG of free energy and the radius of curvature of nucleus.

The manner of change in ΔG is shown in FIG. 3. In the same Figure, the radius of curvature of the stable nucleus when ΔG is the maximum value is $r_c$.

Thus, nuclei grow to become shaped in islands, and further continue to grow, whereby islands contact each other to cover the substrate surface in a reticulate form, until finally it becomes a continuous film to completely cover the substrate surface. Following such a process, a deposited film is formed on the substrate.

In the deposition process as described above, the density of the nuclei formed per unit area on the substrate surface depends greatly on the mutual reaction between the flying atoms and the substrate, and is also greatly influenced by deposition conditions, typically the temperature.

Accordingly, by selecting suitably the kinds of the material of the deposited film and the substrate material, and also setting appropriately the deposition conditions such as temperature, pressure, gas species, etc., the nucleus forming density (or nucleus forming speed) can be determined. Therefore, when one kind of deposition material is used and the deposition material is attempted to be deposited on a deposited surface comprising many kinds of substrate materials which differ greatly from one another in the above mentioned nucleus forming density, the deposited film is formed selectively depending on the nucleus forming density.

For example, the deposited film is selectively formed as described below.

FIGS. 4A–4D illustrate schematically the method for selective formation of a deposited film according to the present invention.

First, the two kinds of the materials constituting the deposition surface are defined as A and B, and the material to be deposited as C. Under certain deposition conditions, the above materials A, B and C are selected so that the nucleus forming density of the material to be deposited C may differ to a great extent on the materials A and B. Here, the nucleus forming density on the material A is supposed to be greater, with the nucleus forming density on the material B being negligibly small.

Figure 4A:
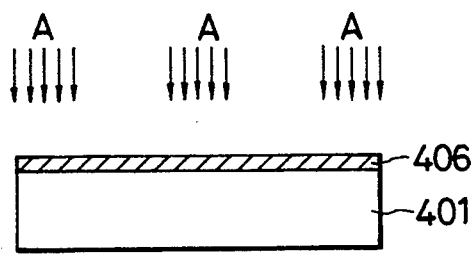
FIGS. 4A–4D illustrate schematically the method for selective formation of a deposited film according to the present invention.

In FIG. 4A, a thin film 406 of the material B is formed according to the thin film forming method on the substrate 401, and ions of the material A are injected in a desired pattern by use of the focused ion beam injection technique therein.

Figure 4B:
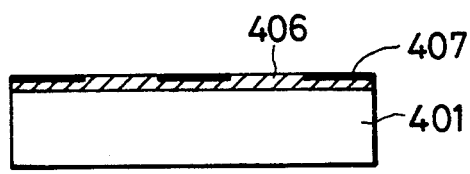

Thus, as shown in FIG. 4B, a region 407 of the material A is formed in a desired pattern in the thin film 406 of the material B.

Figure 4C:
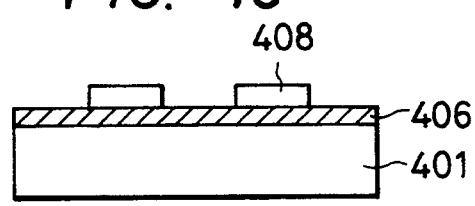

As the method for forming thus a region of the material A of a desired pattern on the deposition surface, as shown in FIG. 4C, a mask 408 may be formed in a desired pattern on the material B, and the ions of the material A may be injected into the whole surface to form a deposition surface as shown in FIG. 4B. Alternatively, a thin film of the material A may be formed on the material B, and the thin film of the material A may be formed into a desired pattern by photolithography.

After the deposition surface is constituted with a desired pattern with the materials A and B as shown in FIG. 4B, the material C is deposited under predetermined deposition conditions. During this operation, the material C is not deposited on the thin film 406 of the material B.

This may be considered because the flying atoms of the material C may be reevaporized before becoming stable nucleus, or because C atoms may react with the material B to form a substance with high vapor pressure, which etches the material B. As its specific example, it has been reported that, when silicon is attempted to be deposited on $SiO_2$ at a high temperature (>900° C.), silicon and $SiO_2$ react with each other to form a substance having high vapor pressure SiO, whereby $SiO_2$ is etched and no silicon is attached at all on $SiO_2$ (T. Yonehara, S. Yoshioka, S. Miyazawa, J. Appl. Phys, 53(10), 6839, 1982).

Figure 4D:
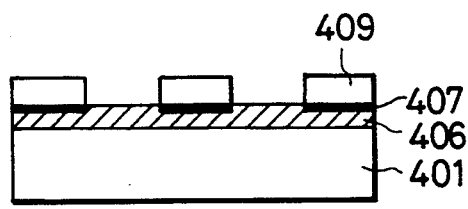

Thus, the material C is deposited only on the region 407 of the material A, and consequently a deposited film 409 with the same pattern as the pattern of the region 407 of the material A is formed self-adjustedly (FIG. 4D).

In the following, the examples of the present invention are described in detail by referring to the drawings.

FIGS. 5A–5D illustrate the steps showing a first example of the method for selective formation of a deposited film according to the present invention.

Figure 5A:
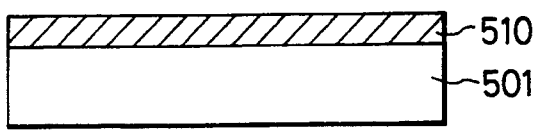
FIGS. 5A–5D illustrate the steps showing an embodiment of the method for selective formation of a deposited film according to the present invention.

First, as shown in FIG. 5A, a single crystalline silicon substrate 501 was thermally oxidized to form an $SiO_2$ film 510 with a thickness of about 0.1 μm on the surface.

Figure 5B:
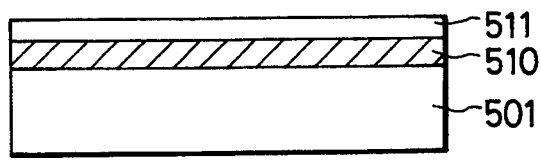

Next, as shown in FIG. 5B, an $Si_3N_4$ film 511 was deposited according to the low pressure chemical vapor deposition method (LPCVD) to a thickness of 0.1 μm.

Figure 5C:
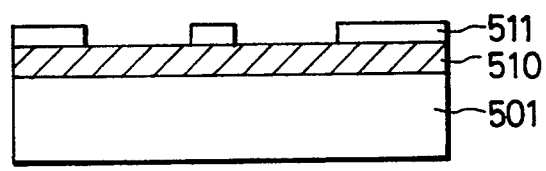

Next, as shown in FIG. 5C, only the $Si_3N_4$ film 511 was partially removed in a desired pattern according to photolithography.

Figure 5D:
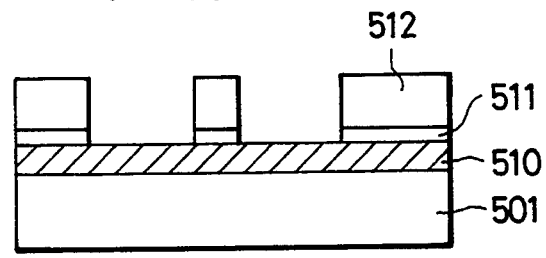

Next, after the substrate was cleaned by permitting HCl gas to flow over the substrate of a high temperature and then, by use of reactive gases such as $SiCl_4$, $SiH_2Cl_2$, etc. diluted with $H_2$, silicon was deposited on the substrate shown in FIG. 5C under reduced pressure (ca. 170 Torr) for 20 minutes. The substrate temperature at that time was 1000° C. By selecting such materials and deposition conditions, as shown in FIG. 5D, a silicon film 512 was formed to a thickness of 6 μm or more only on the $Si_3N_4$ film 511. Thus, a silicon film 512 with the same shape as the shape of the $Si_3N_4$ film 511 was able to be formed self-adjustedly with good precision as extremely beneficial in constituting an integrated circuit.

Figure 6:
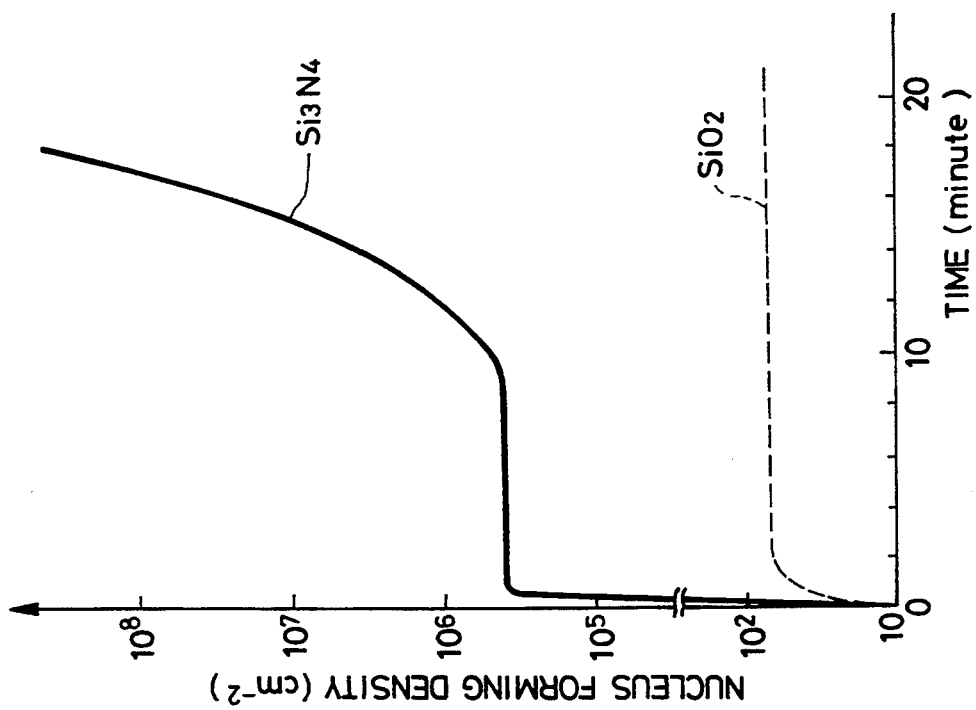
FIG. 6 is a graph showing the changes with lapse of time of the nucleus forming densities on the deposition surface of $SiO_2$ and the deposition surface of $Si_3N_4$.

FIG. 6 is a graph showing the changes with lapse of time in the nucleus forming densities on the deposition surface of $SiO_2$ and the deposition surface of $Si_3N_4$.

As shown in the same graph, about 10 seconds after initiation of deposition, the nucleus forming density on $SiO_2$ becomes saturated at $10^2$ cm$^{-2}$ or less, and its value will be substantially unchanged 20 minutes later.

In contrast, on $Si_3N_4$, the nucleus forming density becomes saturated about 10 seconds later at ca. $4 \times 10^5$ cm$^{-2}$ and does not change for about 10 minutes thereafter, but is then abruptly increased. This phenomenon may be considered to occur because islands are integrated on $Si_3N_4$ to completely cover the deposition surface of $Si_3N_4$ with silicon, and nuclei of silicon are further formed thereon.

In this case, although nucleus formation on $SiO_2$ poses little problem, nucleus formation of $SiO_2$ can be further inhibited by addition of HCl gas into the reaction gas. Also, after completion of deposition, the nuclei on $SiO_2$ may be removed by permitting HCl to flow at a high temperature.

Thus, by selecting $SiO_2$ and $Si_3N_4$ as the materials for the deposition surface, and selecting silicon as the material to be deposited, a sufficiently great difference in nucleus forming density can be obtained as shown in the same graph. When the difference in nucleus forming density is $10^3$-fold or more in terms of the density of stable nucleus as shown in the same graph, sufficient selective formation of a deposited film can be done.

Measurement of the nucleus density is performed by observation with an optical microscope or an electron microscope.

Also, the nucleus forming density on $Si_3N_4$ depends on the composition ratio of Si and N as shown below.

Figure 7:
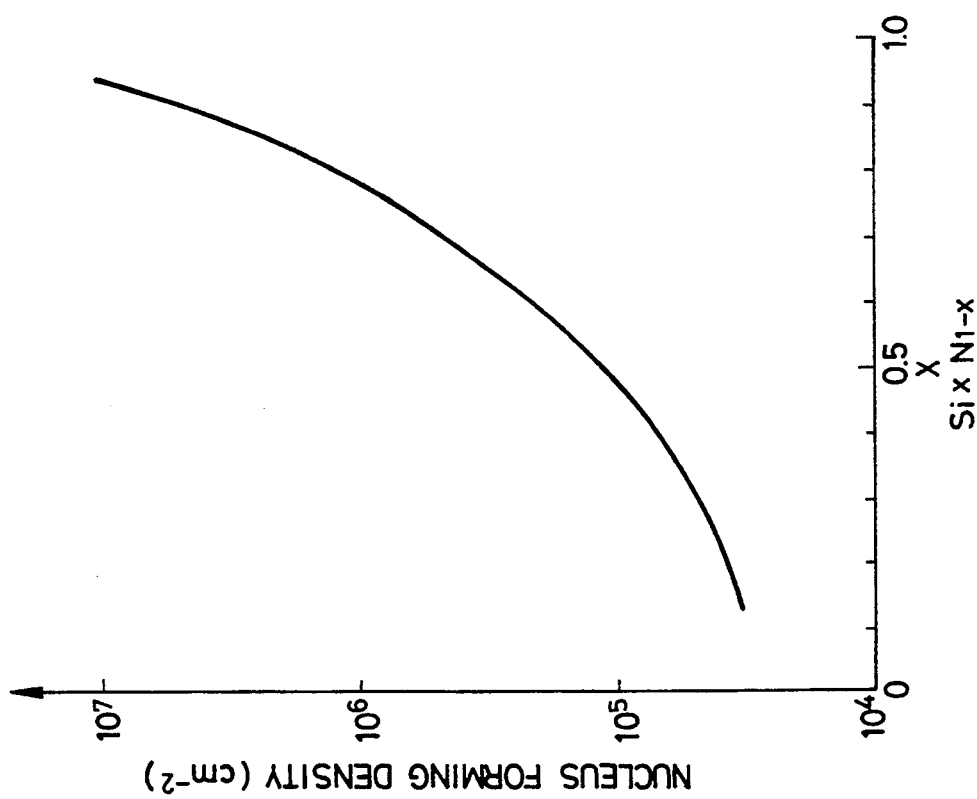
FIG. 7 is a graph showing the relationship between the composition ratio of SiN and the nucleus forming density thereof.

FIG. 7 is a graph showing the relationship between the composition ratio of SiN and the nucleus forming density thereon. Since the nucleus forming density can be controlled by changing thus the composition ratio, it is possible to determine shape, film thickness, etc. of the deposited film of silicon depending on the shape at the deposition surface of SiN and its composition ratio.

FIGS. 8A–8E are steps for preparation of the element separation region, showing a first embodiment of the method for forming the element separation region to which the present invention is applied.

Figure 8A:
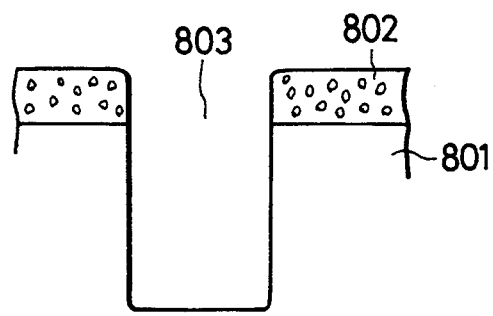
FIGS. 8A–8E illustrate the steps for forming an element separation region showing a first embodiment of the method for forming element separation region according to the present invention.

First, as shown in FIG. 8A, on a substrate of silicon 801 is coated a resist 802 and the resist corresponding to the portion of the element separation region is removed. Subsequently, with the residual resist 802 as the mask, a groove 803 is formed by reactive ion etching (hereinafter called RIE) on the substrate 801.

Figure 8B:
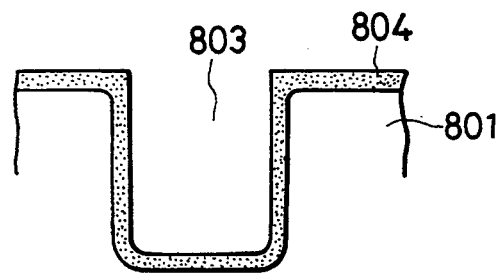

Next, as shown in FIG. 8B, an $SiO_2$ layer 804 with a thickness of 0.1 to 0.5 μm is formed by heat oxidation on the surface of the substrate 801 and the groove 803.

Figure 8C:
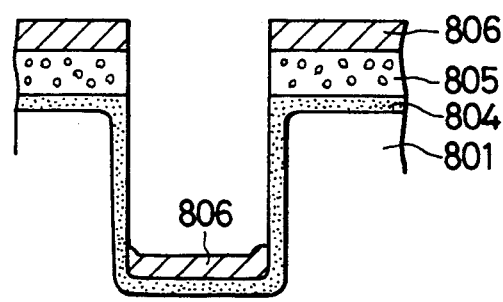

Next, as shown in FIG. 8C, a resist 805 is formed by patterning at the portions other than the groove 803, and subsequently an $Si_3N_4$ layer 806 (or an amorphous silicon layer) is deposited on the resist 805 and the bottom portion of the groove 803 at a temperature to which the resist is resistant according to the ECR (Electron Cyclotron Resonance) method or the GD (Glow Discharge) method, etc. By use of the ECR method, it is possible to effect deposition with directional characteristic, whereby no deposition occurs on the wall surface of the resist 805 and the side surface of the groove 803.

Figure 8D:
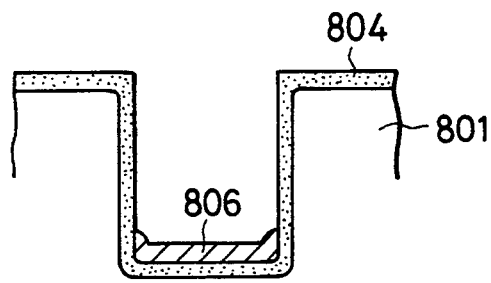

Next, as shown in FIG. 8D, the resist 805 is peeled off and only the $Si_3N_4$ layer 806 is permitted to remain on the bottom portion of the groove 803. Thus, the surface of the substrate 801 is covered with the $SiO_2$ layer 804, while the bottom portion of the groove 803 for element separation region with the $Si_3N_4$ layer 806.

Figure 8E:
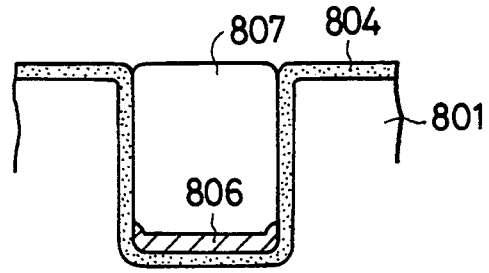

In this structure, as described above, when silicon is deposited under certain deposition conditions, it will not be deposited on the $SiO_2$ layer 804, but silicon which is not amorphous is selectively deposited on the $Si_3N_4$ layer 806. Accordingly, as shown in FIG. 8E, silicon 807 which is not amorphous is deposited only in the groove 803 to fill the groove 803.

FIGS. 9A–9E are steps for forming an element separation region showing a second embodiment of the formation of an element separation region to which the method of the present invention is applied.

Figure 9A:
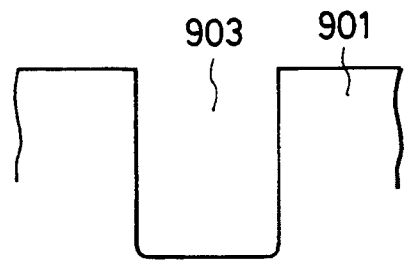
FIGS. 9A–9E illustrate the steps for forming an element separation region showing a second embodiment of the present invention.
Figure 9B:
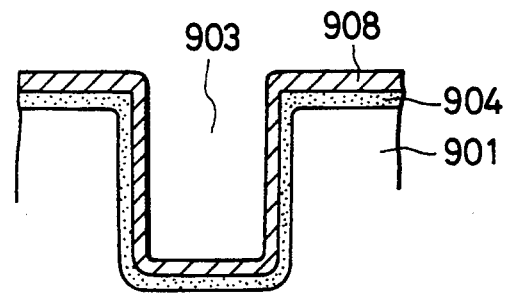

After formation of a groove 903 by RIE on a substrate 901 as shown in FIG. 9A, an $SiO_2$ layer 904 is formed by heat oxidation as shown in FIG. 9B, and further an $Si_3N_4$ layer 908 (or polycrystalline silicon) with a thickness of 0.1 to 0.2 μm is formed according to the LPCVD method thereon.

Figure 9C:
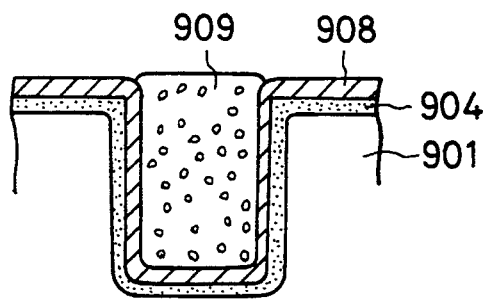
Figure 9D:
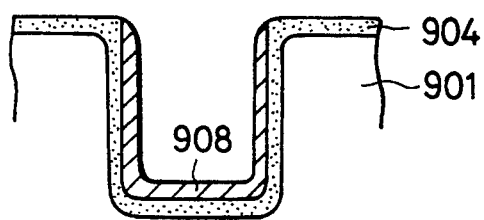
Figure 9E:
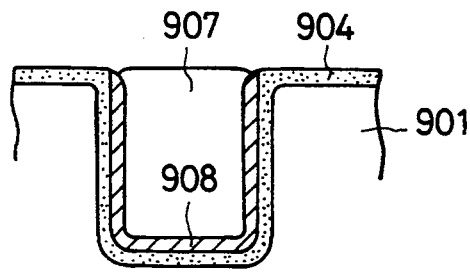

Next, the groove 903 is filled with a resist 909 as shown in FIG. 9C, and the $Si_3N_4$ layer 908 on the surface is etched with the resist 909 as the mask as shown in FIG. 9D, followed by removal of the resist 909, thereby permitting the $Si_3N_4$ layer 908 to remain on the inner wall of the groove 903. Subsequently, as shown in FIG. 9E, similarly as described in the first embodiment mentioned above, silicon 907 which is not amorphous is selectively deposited in the groove 903. In the case of polycrystalline silicon 908 in place of $Si_3N_4$ layer 908, silicon 907 which is not amorphous can also be selectively deposited.

In the structure shown in FIG. 9B, other $Si_3N_4$ layer 908 may be removed with only $Si_3N_4$ layer 908 on the side wall of the groove 903 being permitted to remain by RIE by use of $(CF_4+N_2+O_2)$ to deposit silicon 907 which is not amorphous. This method further simplifies the steps, because the steps for forming and removing the resist 909 are not required.

Figure 10A:
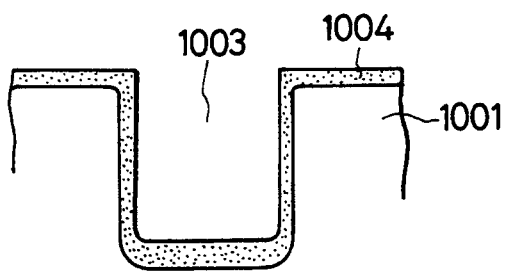
FIGS. 10A–10C illustrate the steps for forming an element separation region showing a third embodiment of the present invention.
Figure 10B:
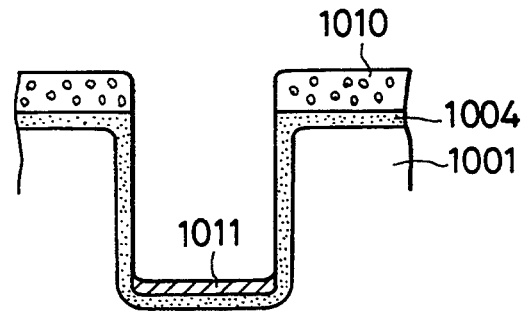
Figure 10C:
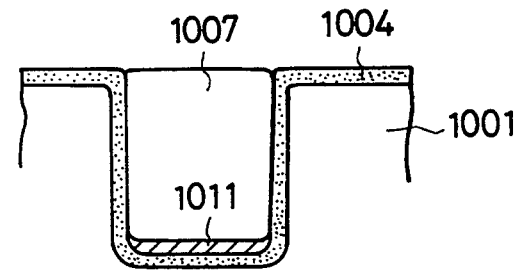

FIGS. 10A–10C are steps for forming an element separation region showing a third embodiment of the formation of an element separation region to which the method of the present invention is applied.

First, as shown in FIG. 10A, a substrate 1001 having formed a groove 1003 thereon is subjected to heat oxidation to form an $SiO_2$ layer 1004.

Next, as shown in FIG. 10B, a resist 1010 is formed on the substrate excluding the portion of the groove 1003, and ions of silicon or nitrogen are injected with the resist 1010 as the mask. By this operation, the $SiO_2$ layer 1004 at the bottom portion of the groove 1003 becomes a modified $SiO_2$ layer 1011 containing excessive silicon or nitrogen.

Next, as shown in FIG. 10C, the resist 1010 is removed to have the $SiO_2$ modified layer 1011 exposed on the bottom portion of the groove 1003 as the deposition surface, and the $SiO_2$ layer 1004 on the substrate surface. And, when silicon is deposited in the same manner as in the first embodiment described above, silicon 1007 which is not amorphous is selectively deposited only on the modified $SiO_2$ layer 1011 containing excessive silicon or nitrogen to fill the groove 1003.

In the present invention, the materials of the deposition surface and the materials to be deposited in the foregoing explanation are not limited by the above embodiments, but metal films can be also selectively formed. For example, it is known that when a tungsten thin film is formed according to the chemical vapor deposition method (CVD) on Si deposition surface and $SiO_2$ deposition surface, tungsten is deposited only on Si deposition surface.

As described in detail above, the method for selective formation of a deposited film according to the present invention can form a deposited film of a desired pattern self-adjustedly by utilizing the difference in nucleus forming density of the material to be deposited depending on the kind of the deposition surface material, and therefore a deposited film of a desired pattern can be formed with high precision, which is extremely advantageous particularly in constituting a highly integrated circuit.

Further, the material of the deposition surface is not required to be limited only to single crystals and, by selecting the material to be deposited and the deposition surface materials having nucleus forming density difference, a deposited film of a semiconductor, a metal, etc. can be selectively formed with high precision even on an amorphous insulating material or a metal.

In addition, when applied to the formation of an element separation region, since the semiconductor material is embedded self-adjustedly in the groove for element separation, no flattening by etching is required, and a minute element separation region can be formed easily to accomplish improvement of the element characteristics.

I claim:

1. A method for selective formation of a deposited film, which comprises providing on at least the bottom portion of a groove for element separation formed on a semiconductor substrate a material with higher nucleus forming density than the material constituting the surface portion of the periphery of the opening of said groove, thereby selectively depositing the deposited film forming material in said groove for element separation to fill said groove.

2. The method according to claim 1, wherein the bottom surface portion of the groove comprises $Si_3N_4$ and the material constituting the surface portion of the periphery of the opening of the groove comprises $SiO_2$.

3. The method according to claim 1, wherein the material constituting the surface portion of the periphery of the opening of the groove comprises $SiO_2$ and the bottom surface portion of the groove comprises silicon oxide containing silicon in excess of the $SiO_2$ constituting the surface portion of the periphery of the opening.

4. The method according to claim 1, wherein the material constituting the surface portion of the periphery of the opening of the groove comprises $SiO_2$ and the bottom surface portion of the groove comprises silicon oxide containing nitrogen in excess of the $SiO_2$ constituting the surface portion of the periphery of the opening.

* * * * *